United States Patent [19]

Lin et al.

[11] Patent Number: 5,518,941
[45] Date of Patent: May 21, 1996

[54] MASKLESS METHOD FOR FORMATION OF A FIELD IMPLANT CHANNEL STOP REGION

[75] Inventors: Chih-Hung Lin, I-Lain; Joe Ko, Msinchu, both of Taiwan

[73] Assignee: United Microelectronics Corporation, Hsinchu, Taiwan

[21] Appl. No.: 312,122

[22] Filed: Sep. 26, 1994

[51] Int. Cl.⁶ .................................................. H01L 21/265
[52] U.S. Cl. .................. 437/43; 437/35; 437/45
[58] Field of Search .................. 437/35, 45, 28, 437/70

[56] References Cited

U.S. PATENT DOCUMENTS 4,984,196 1/1991 Tran et al. ................................ 365/51
5,124,271 6/1992 Havemann .............................. 437/31
5,374,845 12/1994 Havemann .............................. 257/592
5,396,096 3/1995 Akamatsu et al. ..................... 257/336

Primary Examiner—Tom Thomas
Assistant Examiner—Lynne A. Gurley
Attorney, Agent, or Firm—George O. Saile; Larry J. Prescott

[57] ABSTRACT

This invention provides a method of forming a field implant channel stop region and a device using a field implant channel stop region to improve isolation between devices in integrated circuits using field effect transistors. The field implant channel stop region is formed without the use of an extra mask or extra masking steps by means of either a large angle tilted ion implant beam or a higher energy normally directed ion implant beam. The field implant channel stop region is formed with the mask used to form the light doped drain region in place. The field implant channel stop region forms a local increase in the doping level in the device well thereby forming the channel stop region.

18 Claims, 6 Drawing Sheets

MASKLESS METHOD FOR FORMATION OF A FIELD IMPLANT CHANNEL STOP REGION

BACKGROUND OF THE INVENTION

1. Field of the Invention

This invention relates to the formation of a field implant channel stop region and to a semiconductor device with a field implant channel stop region. The field implant channel stop region is formed without using additional masks or masking steps by using either a large angle tilted ion implantation beam or a higher energy normally directed ion implant beam.

2. Description of Related Art

In the formation of large scale integrated circuits using field effect transistors isolation between devices is of critical importance. The formation of a field oxide isolation region has been used for some time to provide isolation between devices. As isolation requirements become more severe a local increase in doping level to form a channel stop region has been used for improved isolation. Conventional methods of forming a channel stop region, however, require the use of an extra mask and extra masking steps. This invention forms the channel stop region without the use of an extra mask or extra masking steps by using either a large angle tilted ion implantation beam or a higher energy normally directed ion implant beam.

U.S. Pat. No. 5,240,874 to Roberts; U.S. Pat. No. 4,987,093 to Teng et al; U.S. Pat. No. 5,116,775 to Katto et al; and 5,004,701 to Motokawa show ion implantation after the formation of the field oxide for the formation of a channel stop. U.S. Pat. No. 5,290,718 to Fearon et al and U.S. Pat. No. 5,019,520 to Komori et al show ion implantation after the formation of the field oxide to adjust the channel threshold.

SUMMARY OF THE INVENTION

The principle objective of this invention is to provide a method of forming a field implant channel stop region in a semiconductor device without requiring an extra mask or masking steps to form the channel stop region.

Another principle objective of this invention is to provide a semiconductor device with a field implant channel stop region to improve isolation between separate devices in semiconductor integrated circuits.

These objectives are achieved by using a large angle tilt ion implantation beam in forming the field implant channel stop region. An isolation well and field oxide isolation regions are formed in a silicon substrate. A gate oxide layer and polysilicon gate electrode is formed on the silicon substrate. A second polysilicon pattern is formed on the field oxide. A layer of silicon nitride is formed on the polysilicon gate electrode and the second polysilicon pattern. A light doped drain photoresist mask is formed on the silicon substrate outside the isolation well. The field implant channel stop region is then formed by means of a large angle tilted ion implant beam. The tilted ion implant beam implants impurities beneath the poiysilicon gate electrode and beneath the field oxide region at the edge of the isolation well, thereby forming the field implant channel stop region. The silicon nitride layer is necessary to achieve the desired shape of the field implant channel stop region. The light doped drain region is then formed using normally directed ion implantation. The field implant channel stop region is formed in this manner without the need for an additional masking step and is self-aligned. The method works equally well if the order of formation of the field implant channel stop region and the light doped drain region are interchanged. The source/drain regions and insulation and passivation layers are formed by conventional means.

These objectives can also be achieved by using a higher energy ion implantation beam in forming the field implant channel stop region. An isolation well and field oxide isolation regions are formed in a silicon substrate. A gate oxide layer and polysilicon gate electrode is formed on the silicon substrate. A second polysilicon pattern is formed on the field oxide. A light doped drain. photoresist mask is formed on the silicon substrate outside the isolation well. The field implant channel stop region is then formed by means of a higher energy ion implant beam. The higher energy ion implant beam implants impurities beneath the polysilicon gate electrode and beneath the field oxide region at the edge of the isolation well, thereby forming the field implant channel stop region. The light doped drain region is then formed using normally directed ion implantation. The field implant channel stop region is formed in this manner without the need for an additional masking step and is self-aligned. The method works equally well if the order of formation of the field implant channel stop region and the light doped drain region are interchanged. The source/drain regions and insulation and passivation layers are formed by conventional means.

The field implant channel stop region increases the doping locally in the isolation well in the channel stop region. This local doping level increase improves the isolation between devices in an integrated circuit structure.

DESCRIPTION OF THE PREFERRED EMBODIMENTS

Figure 1:
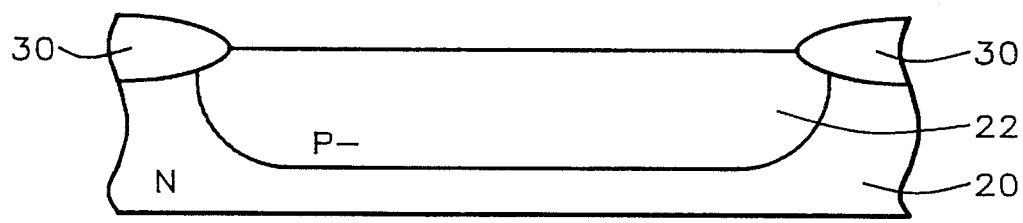
FIG. 1 is a cross section view of the silicon substrate showing the isolation well and the field oxide region.
Figure 2:
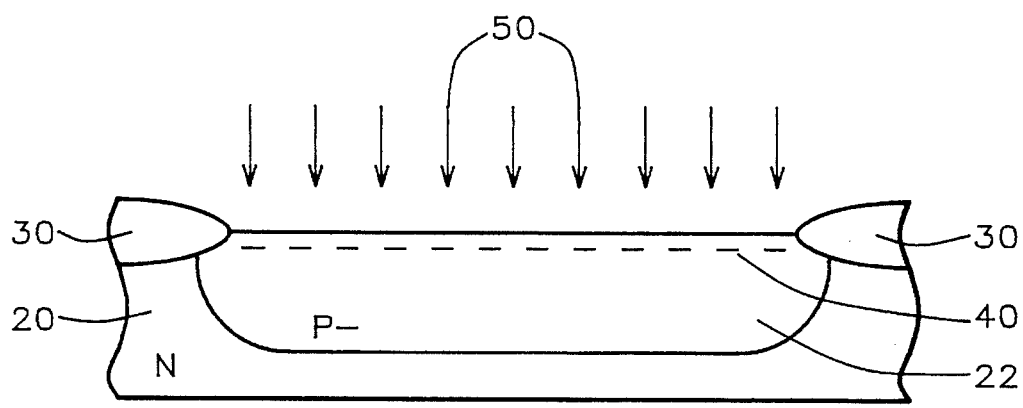
FIG. 2 is a cross section view of the silicon substrate showing the formation of the threshold voltage adjustment region.

Refer now to FIG. 1 through FIG. 7, there is shown a preferred embodiment of a method of forming a field implant channel stop region. FIG. 1 shows a cross section of an N type silicon substrate 20 with a P⁻ well 22 and a field oxide region 30 formed therein by thermal oxide growth. Next, as shown in FIG. 2, a threshold voltage adjustment region 40 is formed in the P⁻ well by means of ion implantation using an ion implant beam 50 of $BF_2$ with between about $2 \times 10^{12}$ and $6 \times 10^{12}$ ions/cm² at between about 40 and 70 keV.

Figure 3:
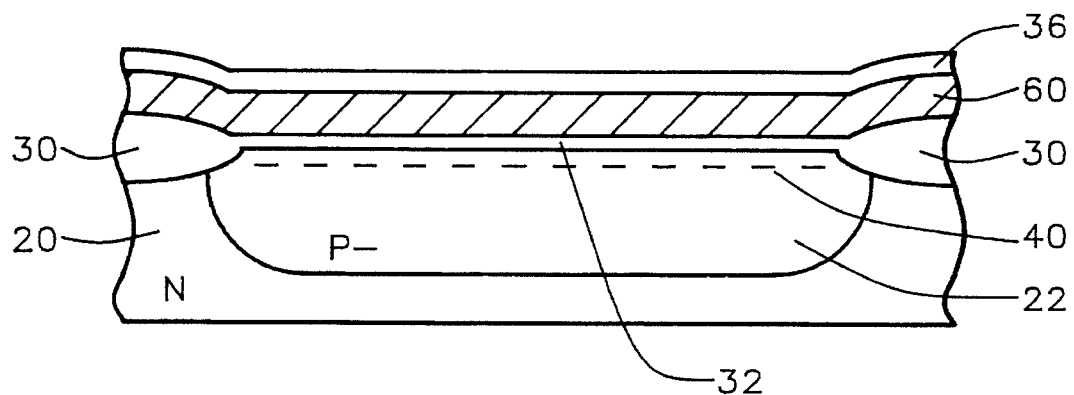
FIG. 3 is a cross section view of the silicon substrate showing the formation of the gate dielectric layer, the polysilicon gate electrode layer, and the silicon nitride layer.
Figure 4:
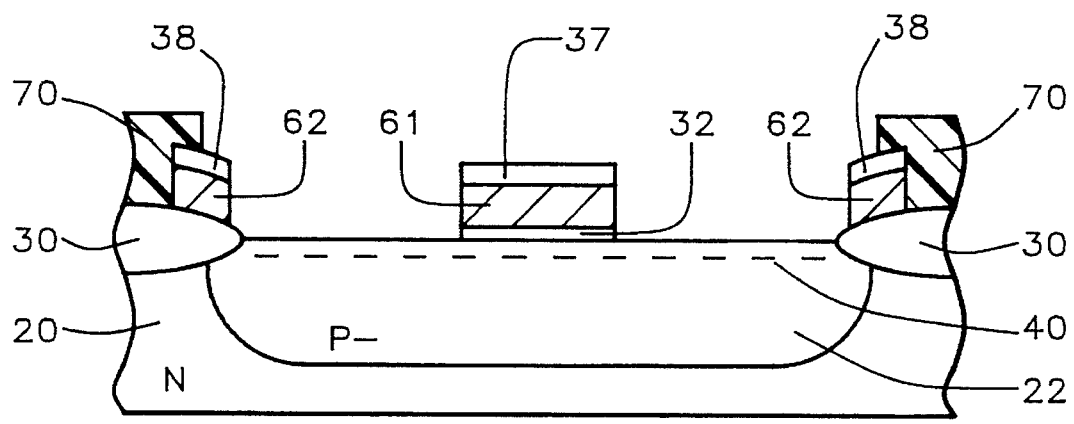
FIG. 4 is a cross section view of the silicon substrate showing the formation of the gate electrode the second pattern and the light doped drain photoresist mask.

Next, as shown in FIG. 3, a gate oxide layer 32, such as $SiO_2$ with a thickness of between about 60 and 250 Angstroms, is formed on the silicon substrate by means of thermal oxide growth. Next, a layer of polysilicon 60 with a thickness of between about 2000 and 5000 Angstroms is formed on the field oxide layer and gate oxide layer using conventional means. An example of such conventional means is given in "VLSI PROCESS TECHNOLOGY" Second Edition, by S. M. Sze, published by McGraw-Hill Book Co., New York, N.Y., 1988, Pages 235–247. Next a layer of silicon nitride 36, $Si_3N_4$, with a thickness of between about 1000 and 3000 Angstroms is formed on the layer of polysilicon 60 using low pressure chemical vapor deposition. Next, as shown in FIG. 4, a gate electrode pattern is formed in the layers of silicon nitride 37, polysilicon 61, and gate oxide 32 and a second pattern is formed in the layers of polysilicon 62 and silicon nitride 38 using conventional lithographic techniques and etching. Examples of such conventional methods of etching polysilicon, $SiO_2$, and silicon nitride are given in the previously cited book by Sze Pages 221–226. A light doped drain photoresist mask 70 is then formed on the silicon substrate to keep the subsequent ion implantation operations from affecting the N type silicon regions outside of the P⁻ well.

Figure 5:
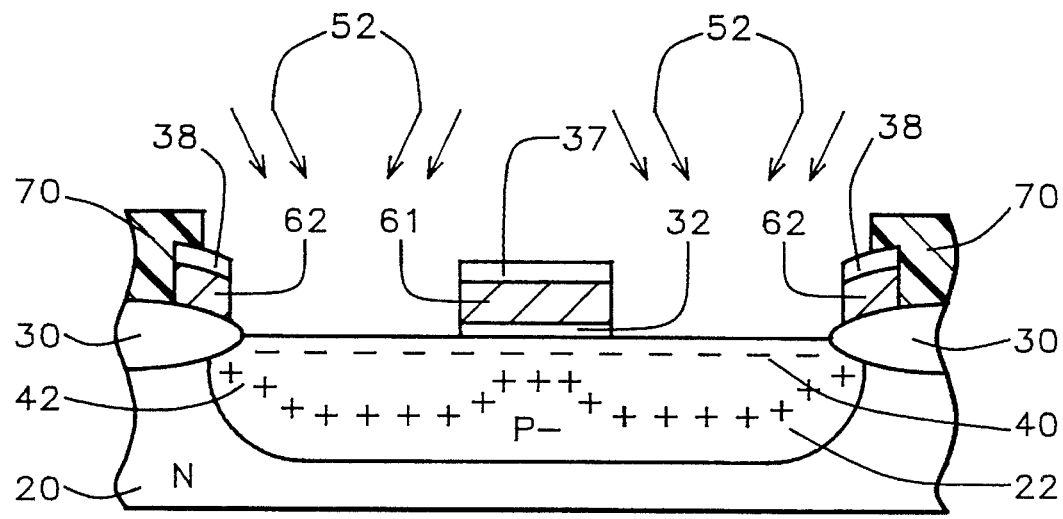
FIG. 5 is a cross section view of the silicon substrate showing the formation of the field implant channel stop region using large angle tilted ion implantation.
Figure 6:
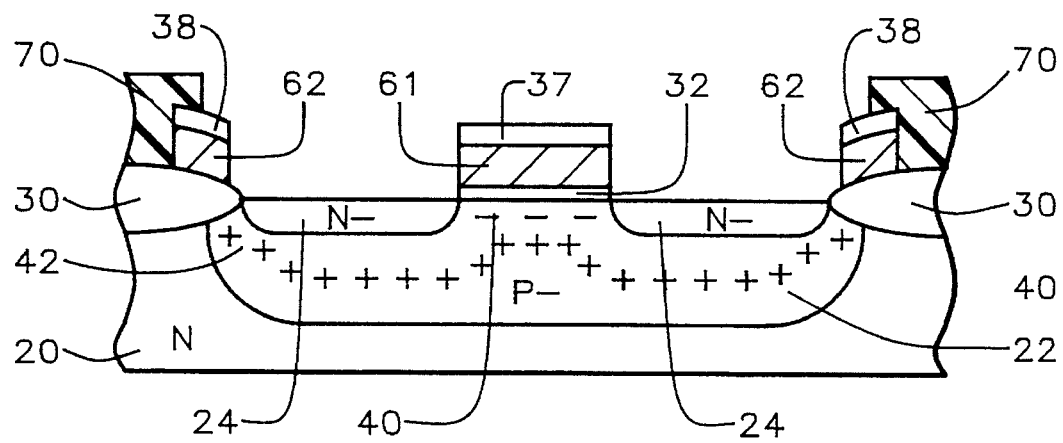
FIG. 6 is a cross section view of the silicon substrate showing the formation of the light doped drain region.

Next, as shown in FIG. 5, the field implant channel stop region 42 is formed by means of a large angle tilt ion implantation beam using masking provided by the gate electrode pattern formed in the gate oxide layer 32, polysilicon layer 61, and silicon nitride layer 37; the second pattern formed in the polysilicon layer 62 and silicon nitride layer 38; and the light doped drain photoresist mask 70. The large angle tilt ion implantation beam 52 forms an angle of between about 30° and 60° with a line perpendicular to the surface of the silicon substrate and uses a $B^{11}$ ion beam with between about $5 \times 10^{12}$ and $2.5 \times 10^{13}$ ions/cm² at between about 150 and 250 keV. The silicon nitride layer is necessary to give the proper shape to the field implant channel stop region 42. Next, as shown in FIG. 6, the light doped drain regions 24 are formed by means of light doped drain ion implantation also using masking provided by the gate electrode pattern formed in the gate oxide layer 32, polysilicon layer 61, and silicon nitride layer 37; the second pattern formed in the polysilicon layer 62 and silicon nitride layer 38; and the light doped drain photoresist mask 70. The light doped drain ion implantation uses an ion beam of $P^{31}$ with between about $1 \times 10^{13}$ and $1 \times 10^{14}$ ions/cm² at between about 30 and 80 keV. This embodiment describes forming the field implant channel stop region followed by formation of the light doped drain region, however these two steps can equally well be interchanged. This method makes use of the masking used for the light doped drain region and does not require a separate mask or extra masking steps.

Figure 7:
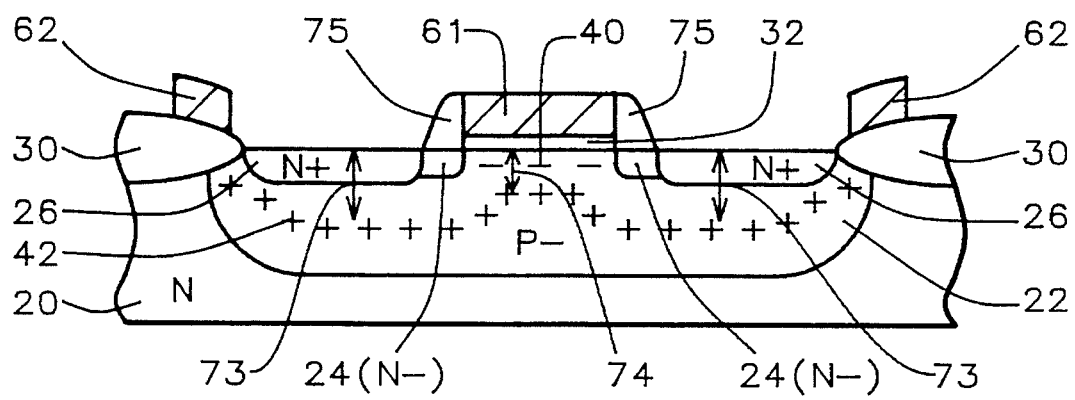
FIG. 7 is a cross section view of the silicon substrate showing the removal of the silicon nitride layer and the light doped drain photoresist mask and the formation of the source/drain regions.

Next, as shown in FIG. 7, the light doped drain photoresist mask is stripped using conventional means and the silicon nitride layer, $Si_3N_4$, is removed using carbon tetrafluoride ambient or wet etching. An oxide spacer 75 is formed on the sidewalls of the polysilicon gate electrode 61 using conventional means. An example of such conventional means is given in the previously cited book by Sze Pages 479–483. The source/drain regions 26 are then formed using ion implantation. The distance 73 between the field implant channel stop region below the source/drain regions and the surface of the silicon substrate is between about 0.4 and 0.8 microns. The distance 74 between the field implant channel stop region below the gate electrode and the surface of the silicon substrate is between about 0.2 and 0.5 microns. An insulating dielectric layer, such as borophosphosilicate glass, with contact openings, not shown, is then formed on the substrate. Metal contacts, not shown, are formed in the contact openings, a patterned metal conductor layer, not shown, is formed on the insulating dielectric layer and a passivating dielectric layer, not shown, is formed over the substrate.

Figure 8:
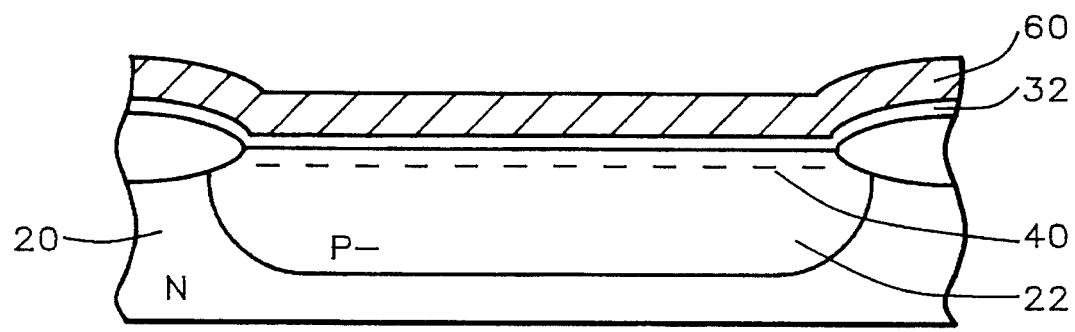
FIG. 8 is a cross section view of the silicon substrate showing the formation of the gate oxide layer and the polysilicon gate electrode layer.

Refer now to FIG. 1, FIG. 2 and FIG. 8 through FIG. 11, there is shown another embodiment of a method of forming a field implant channel stop region. As shown in FIG. 1, FIG. 2, and FIG. 8 the method of this embodiment is the same as in the previous embodiment through the step of forming a polysilicon gate electrode layer 60.

Figure 9:
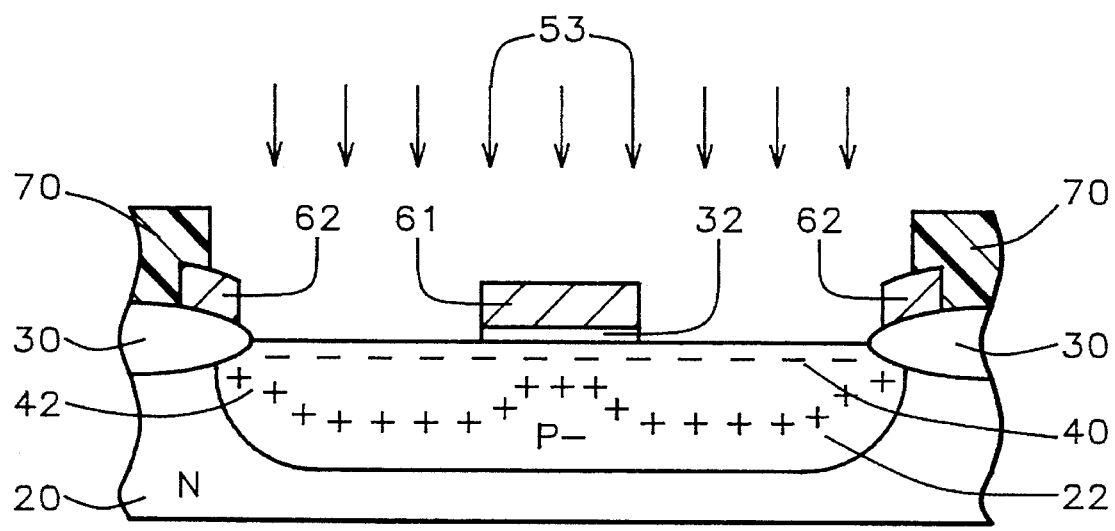
FIG. 9 is a cross section view of the silicon substrate showing the formation of the field implant channel stop region using a normally directed higher energy ion implant beam.

As shown in FIG. 9, a gate electrode pattern is then formed in the polysilicon 61 and gate oxide 32 layers and a second pattern is formed in the polysilicon 62 layer using conventional lithographic techniques and etching. Examples of such conventional methods etching polysilicon and $SiO_2$ are given in the previously cited book by Sze Pages 221–226. A light doped drain photoresist mask 70 is then formed on the silicon substrate to keep the subsequent ion implantation operations from affecting the N type silicon regions outside of the P⁻ well.

Figure 10:
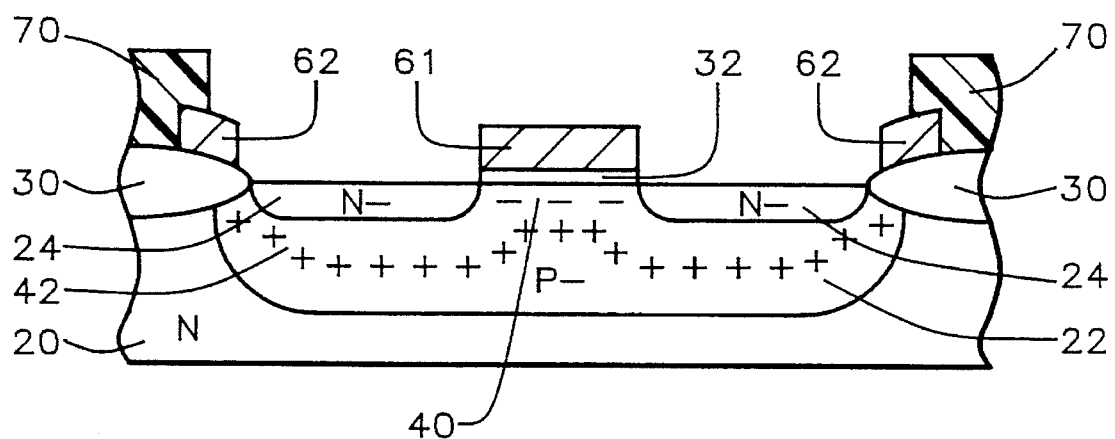
FIG. 10 is a cross section view of the silicon substrate showing the formation of the light doped drain region.

Next, as shown in FIG. 9, the field implant channel stop region 42 is formed by means of a normally directed higher energy ion implantation beam 53 using masking provided by the gate electrode pattern formed in the gate oxide layer 32 and polysilicon layer 61; the second pattern formed in the polysilicon layer 62; and the light doped drain photoresist mask 70. The normally directed ion implantation beam 53 uses a $B^{11}$ ion beam with between about $5 \times 10^{12}$ and $2.5 \times 10^{13}$ ions/cm² at between about 200 and 400 keV. Next, as shown in FIG. 10, the light doped drain regions 24 are formed by means of light doped drain ion implantation also using masking provided by the gate electrode pattern formed in the gate oxide layer 32 and polysilicon layer 61; the second pattern formed in the polysilicon layer 62; and the light doped drain photoresist mask 70. The light doped drain ion implantation uses an ion beam of $P^{31}$ with between about $1 \times 10^{13}$ and $1 \times 10^{14}$ ions/cm² at between about 30 and 80 keV. This embodiment describes forming the field implant channel stop region followed by formation of the light doped drain region, however these two steps can equally well be interchanged. This method makes use of the masking used for the light doped drain region and does not require a separate mask or extra masking steps.

Figure 11:
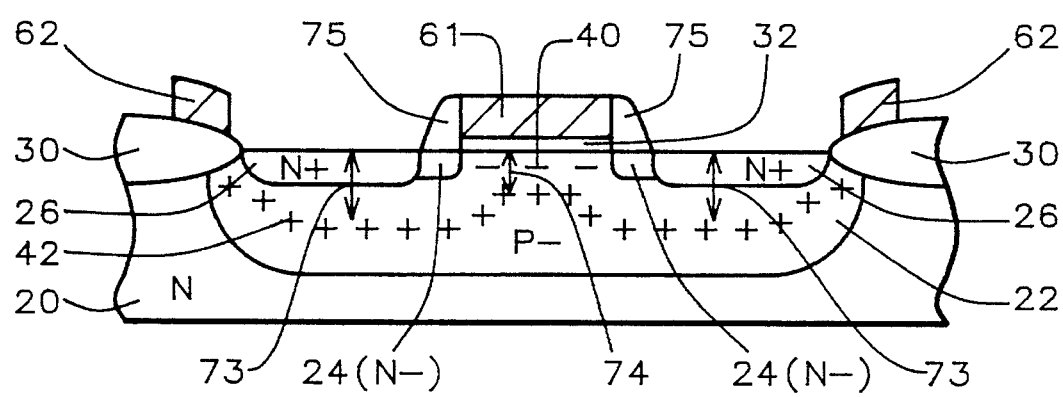
FIG. 11 is a cross section view of the silicon substrate showing the removal of the light doped drain photoresist mask and the formation of title source/drain regions.

As shown in FIG. 11, the light doped drain photoresist mask is then stripped using conventional means. An oxide spacer 75 is formed on the sidewalls of the polysilicon gate electrode 61 using conventional means. An example of such conventional means is given in the previously cited book by Sze Pages 479–483. The source/drain regions 26 are then formed using ion implantation. The distance 73 between the field implant channel stop region below the source drain regions and the surface of the silicon substrate is between about 0.4 and 0.8 microns. The distance 74 between the field implant channel stop region below the gate electrode and the surface of the silicon substrate is between about 0.2 and 0.5 microns. An insulating dielectric layer, such as borophosphosilicate glass, with contact openings, not shown, is then formed on the substrate. Metal contacts, not shown, are formed in the contact openings, a patterned metal conductor layer, not shown, is formed on the insulating dielectric layer and a passivating dielectric layer, not shown, is formed over the substrate.

Refer now to FIG. 7, there is shown an embodiment of a semiconductor device with a field implant channel stop region. A $P^-$ well 22 is formed in an N type silicon substrate 20 with field oxide isolation regions 30 formed therein. Source/drain regions 26, light doped drain regions 24, and a threshold voltage adjustment region 40 are formed in the silicon substrate 20. A gate oxide layer 32 and a polysilicon gate electrode 61 are formed on the silicon substrate 20. A field implant channel stop region 42 is formed in the silicon substrate. The distance 73 between the field implant channel stop region below the source drain regions and the surface of the silicon substrate is between about 0.4 and 0.8 microns. The distance 74 between the field implant channel stop region below the gate electrode and the surface of the silicon substrate is between about 0.2 and 0.5 microns. An insulating dielectric layer, such as borophosphosilicate glass, with contact openings, not shown, is then formed on the substrate. Metal contacts, not shown, are formed in the contact openings, a patterned metal conductor layer, not shown, is formed on the insulating dielectric layer and a passivating dielectric layer, not shown, is formed over the substrate.

The field implant channel stop region 42 locally increases the doping of the $P^-$ well in the channel stop region. This local doping level increase improves the isolation between devices in an integrated circuit structure.

While the invention has been particularly shown and described with reference to the preferred embodiments thereof, it will be understood by those skilled in the art that various changes in form and details may be made without departing from the spirit and scope of the invention.

What is claimed is:

1. A method of forming a field implant channel stop region, comprising the steps of:

providing a semiconductor substrate with an isolation well formed therein;

forming a field oxide isolation region in said semiconductor substrate;

forming a threshold voltage adjustment region in said semiconductor substrate by means of a first ion implantation;

forming a gate dielectric layer over said semiconductor substrate;

forming a conducting gate electrode layer over said gate dielectric layer;

forming a surface dielectric layer over said conducting gate electrode layer;

forming a gate electrode pattern in said conducting gate electrode layer, said gate dielectric layer, and said surface dielectric layer;

forming a second pattern in said conducting gate electrode layer and said surface dielectric layer;

forming a lightly doped drain photoresist mask on said semiconductor substrate;

forming a field implant channel stop region in said semiconductor substrate by means of a third ion implantation beam wherein said field implant channel step region extends continuously from below the entirety of said gate electrode pattern to below a part of said field oxide isolation region and the distance between that part of said field implant channel stop region located below said gate electrode pattern and the surface of said semiconductor substrate is between about 0.2 and 0.5 microns;

forming lightly doped drain regions in said semiconductor substrate using a second ion implantation;

stripping said surface dielectric layer and said lightly doped drain photoresist mask;

forming source/drain regions in said semiconductor substrate above a part of said field implant channel stop region wherein said field implant channel stop region of located continuously below the entirety of said source/drain regions, below the entirety of said gate electrode pattern, and below a part of said field oxide region and the distance between that part of said field implant channel stop region located below said source/drain regions and the surface of said semiconductor substrate is between about 0.4 and 0.8 microns;

forming an insulating dielectric layer with contact openings on said semiconductor substrate;

forming metal contacts in said contact openings in said insulating dielectric layer;

forming a patterned metal conductor electrode layer on said insulating dielectric layer; and forming a passivation layer over said insulating dielectric layer.

2. The method of claim 1 wherein said isolation well is of a $P^-$ type conductivity.

3. The method of claim 1 wherein said gate dielectric layer has a thickness of between about 60 and 250 Angstroms.

4. The method of claim 1 wherein said conducting gate electrode layer is polysilicon with a thickness of between about 2000 and 5000 Angstroms.

5. The method of claim 1 wherein said surface dielectric layer is silicon nitride with a thickness of between about 1000 and 3000 Angstroms, 6. The method of claim 1 wherein said third ion implantation beam forms an angle of between about 30° and 60° with a line perpendicular to said semiconductor substrate.

7. The method of claim 1 wherein said third ion implantation beam is $B^{11}$ with between about $5\times10^{12}$ and $2.5\times10^{13}$ ions/cm$^2$ at between about 150 and 250 keV.

8. The method of claim 1 wherein said second ion implantation uses an ion beam of $P^{31}$ with between about $1\times10^{13}$ and $1\times10^{14}$ ions/cm$^2$ at between about 30 and 80 keV, 9. The method of claim 1 wherein said field oxide isolation region is $SiO_2$.

10. The method of claim 1 wherein said field implant channel stop region is formed after forming said field oxide isolation region; after forming said gate electrode pattern in said conducting gate electrode layer, said gate dielectric layer, and said surface dielectric layer; after forming said second pattern in said conducting gate electrode layer and said surface dielectric layer; after forming said lightly doped drain photoresist mask; and without using additional masks.

11. A method of forming a field implant channel stop region, comprising the steps of:

providing a semiconductor substrate with an isolation well formed therein;

forming a field oxide isolation region in said semiconductor substrate;

forming a threshold voltage adjustment region in said semiconductor substrate by means of a first ion implantation;

forming a gate dielectric layer over said semiconductor substrate;

forming a conducting gate electrode layer over said gate dielectric layer;

forming a gate electrode pattern in said conducting gate electrode layer and said gate dielectric layer;

forming a second pattern in said conducting gate electrode layer;

forming a lightly doped drain photoresist mask on said semiconductor substrate;

forming a field implant channel stop region in said semiconductor substrate by means of a third ion implantation wherein said field implant channel stop region extends continuously from below the entirety of said gate electrode pattern to below a part of said field oxide isolation region and the distance between that part of said field implant channel stop region located below said gate electrode pattern and the surface of said semiconductor substrate is between about 0.2 and 0.5 microns;

forming lightly doped drain regions in said semiconductor substrate by means of a second ion implantation;

stripping said lightly doped drain photoresist mask;

forming source/drain regions in said semiconductor substrate above a part of said field implant channel stop region wherein said field implant channel stop region is located continuously below the entirety of said source/drain regions, below the entirety of said gate electrode pattern, and below a part of said field oxide region and the distance between that part of said field implant channel stop region located below said source/drain regions and the surface of said semiconductor substrate is between about 0.4 and 0.8 microns;

forming an insulating dielectric layer with contact openings on said semiconductor substrate;

forming metal contacts in said contact openings in said insulating dielectric layer;

forming a patterned metal conductor electrode player on said insulating dielectric layer; and forming a passivation layer over said insulating dielectric layer.

12. The method of claim 11 wherein said isolation well is of a $P^-$ type conductivity.

13. The method of claim 11 wherein said gate dielectric layer has a thickness of between about 60 and 250 Angstroms.

14. The method of claim 11 wherein said conducting gate electrode layer is polysilicon with a thickness of between about 2000 and 5000 Angstroms.

15. The method of claim 11 wherein said third ion implantation uses an ion beam of $B^{11}$ with between about $5 \times 10^{12}$ and $2.5 \times 10^{13}$ ions/cm$^2$ at between about 200 and 400 keV, 16. The method of claim 11 wherein said second ion implantation uses an ion beam of $P^{31}$ with between about $1 \times 10^{13}$ and $1 \times 10^{14}$ ions/cm$^2$ at between about 30 and 80 keV, 17. The method of claim 11 wherein said field oxide isolation region is $SiO_2$.

18. The method of claim 11 wherein said field implant channel stop region is formed after forming said field oxide isolation region, after forming said gate electrode pattern in said conducting gate electrode layer and said gate dielectric layer, after forming said second pattern in said conducting gate electrode layer, after forming said lightly doped drain photoresist mask, and without using additional masks.

* * * * *